US007290078B2

(12) United States Patent
Zink et al.

(10) Patent No.: US 7,290,078 B2
(45) Date of Patent: Oct. 30, 2007

(54) SERIAL MEMORY COMPRISING MEANS FOR PROTECTING AN EXTENDED MEMORY ARRAY DURING A WRITE OPERATION

(75) Inventors: Sebastien Zink, Aix en Provence (FR); Paola Cavaleri, Rousset (FR); Bruno Leconte, Rousset (FR)

(73) Assignee: STMicroelectronics S.A., Montrouge (FR)

( * ) Notice: Subject to any disclaimer, the term of this patent is extended or adjusted under 35 U.S.C. 154(b) by 266 days.

(21) Appl. No.: 11/008,588

(22) Filed: Dec. 9, 2004

(65) Prior Publication Data
US 2006/0056262 A1    Mar. 16, 2006

(30) Foreign Application Priority Data
Dec. 12, 2003    (FR)    ................................ 03 14621
Dec. 12, 2003    (FR)    ................................ 03 14622
Dec. 12, 2003    (FR)    ................................ 03 14628

(51) Int. Cl.
*G06F 12/06* (2006.01)
*G06F 12/14* (2006.01)
*G11C 11/34* (2006.01)

(52) U.S. Cl. ........................... 711/2; 711/103; 711/156; 711/163; 711/212

(58) Field of Classification Search .................... 711/2, 711/212
See application file for complete search history.

(56) References Cited

U.S. PATENT DOCUMENTS

| 4,128,883 A | | 12/1978 | Duke et al. ................ 364/200 |
| 4,665,506 A | * | 5/1987 | Cline et al. ............ 365/189.01 |
| 4,905,137 A | | 2/1990 | Goodhue et al. |
| 4,908,789 A | * | 3/1990 | Blokkum et al. ............ 711/172 |
| 5,303,201 A | | 4/1994 | Sakamoto ..................... 365/236 |
| 5,357,621 A | * | 10/1994 | Cox ............................ 711/172 |
| 5,428,566 A | * | 6/1995 | Robinson ....................... 365/63 |
| 5,430,859 A | * | 7/1995 | Norman et al. ............. 711/103 |

(Continued)

FOREIGN PATENT DOCUMENTS

EP    0 028 916 A2    5/1981

OTHER PUBLICATIONS

Kuriyama, H., et al., "An 8-ns 4-Mb Serial Access Memory," *IEEE Journal of Solid-State Circuits* 26(4):502-506, Apr. 1991.

*Primary Examiner*—Reginald Bragdon
*Assistant Examiner*—Tyler Willhite
(74) *Attorney, Agent, or Firm*—Lisa K. Jorgenson; Robert Iannucci; Seed IP Law Group PLLC (57) ABSTRACT

The present invention relates to a memory on a silicon microchip, having a serial input/output, an integrated memory array addressable under N bits, and at least one register that is read accessible, after applying a command for reading the register to the memory. The memory stores a most significant address allocated to the memory within an extended memory array wherein the memory is incorporated or intended to be incorporated. A master memory signal is generated based on the most significant address allocated to the memory. A central processing unit executes a command for reading the register and supplies the content of the register to the serial input/output of the memory only if the memory is the master memory within the extended memory array. The memory includes slave memories whose operation depends upon the read/write status of the master memory.

26 Claims, 5 Drawing Sheets

U.S. PATENT DOCUMENTS

| | | | |
|---|---|---|---|
| 5,561,628 A | 10/1996 | Terada et al. | 365/185.04 |
| 5,857,214 A | 1/1999 | Dey | |
| 5,895,480 A | 4/1999 | Yung et al. | 711/5 |
| 5,956,349 A * | 9/1999 | Watanabe et al. | 714/718 |
| 6,175,891 B1 | 1/2001 | Norman et al. | |
| 6,889,268 B2 | 5/2005 | Chae et al. | |
| 2001/0018724 A1 | 8/2001 | Sukegawa | 711/103 |
| 2003/0021139 A1 | 1/2003 | Nakamura et al. | 365/63 |

* cited by examiner

SERIAL MEMORY COMPRISING MEANS FOR PROTECTING AN EXTENDED MEMORY ARRAY DURING A WRITE OPERATION

BACKGROUND OF THE INVENTION

1. Field of the Invention

The present invention relates to serial memories on silicon microchips, and more particularly to the production of an extended memory array by juxtaposition of a plurality of serial memories.

2. Description of the Related Art

The memories integrated into silicon chips have an integrated memory array of limited size, generally lower than the memory space required by certain applications. For example, computer peripherals such as printers require high-capacity memories to store large amounts of data. As a result, it is common practice to group together several silicon microchips to form extended memory arrays constituted by the juxtaposition of the integrated memory arrays present in each of the memories. This grouping generally involves stacking silicon microchips in a single case or stacking cases each comprising a silicon microchip.

Figure 1:
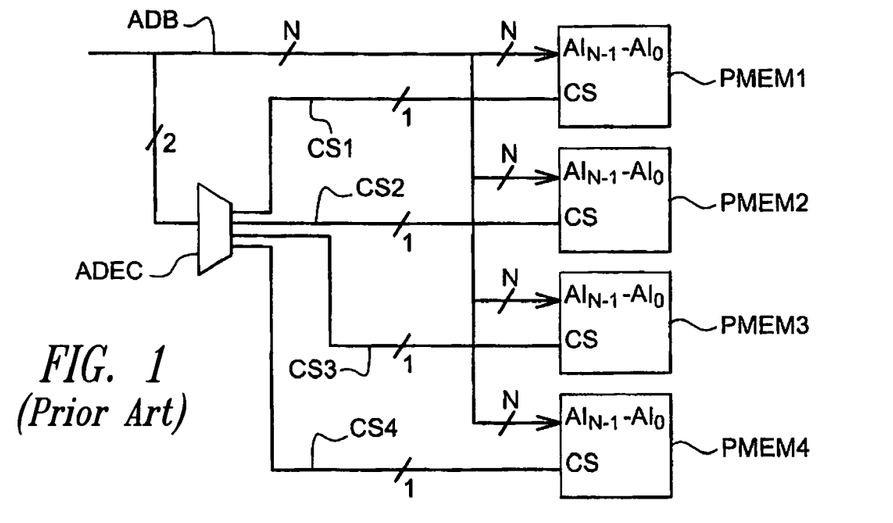
FIG. 1 described above represents an extended memory array comprising parallel-type memories, FIGS. 2A, 2B described above respectively represent an extended memory array comprising classical serial memories and the structure of these serial memories.
Figure 2A:
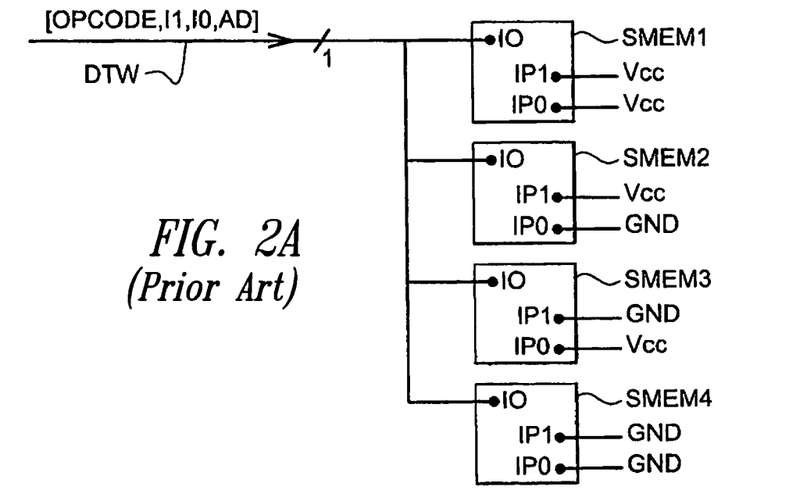
Figure 2B:
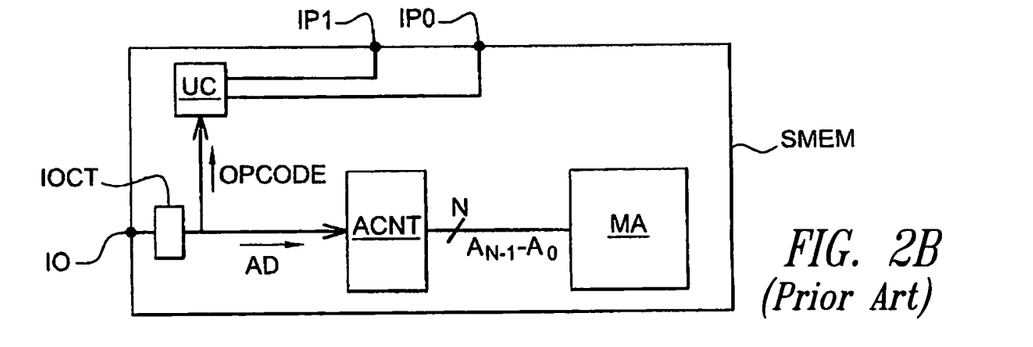

FIGS. 1 and 2A, 2B show two classical methods enabling an extended memory array to be produced, respectively with parallel-type and serial memories.

In FIG. 1, four identical memories PMEM1, PMEM2, PMEM3, PMEM4 of parallel input/output type are grouped together to obtain an extended memory array. The memories each comprise an integrated memory array addressable under N bits (not shown). Each memory comprises N address inputs $AI_{N-1}$-$AI_0$ in parallel, connected to the N least significant address wires of an address bus ADB. The address bus comprises N+2 address wires, required by the addressing of the extended memory array the size of which is here four times that of the memory arrays integrated into the silicon microchips. The selection of each memory within the extended memory array is performed by means of a selecting input CS ("Chip Select") provided on each silicon microchip. For this purpose, the two most significant wires of the address bus ADB are applied to an address decoder ADEC which supplies four selecting wires CS1, CS2, CS3, CS4, each selecting wire being connected to the input CS of a memory.

This example shows that the production of an extended memory array by means of integrated circuits with parallel inputs results in an unacceptable increase in the number of jumper wires so as to be able to individually select the memories within the extended memory array.

FIG. 2A relates more specifically to the technical field of the present invention and represents an extended memory array produced with four identical serial input/output memories SMEM1, SMEM2, SMEM3, SMEM4, or serial memories, the structure of which is schematically shown in FIG. 2B.

Each memory SMEM comprises a serial input/output 10, an input/output circuit IOCT, a central processing unit UC, an address counter ACNT of N bits and an integrated memory array MA addressable under N bits (FIG. 2B). The circuit IOCT is linked to the serial input/output 10 and transforms data received in serial form into parallel data, and vice versa. Each serial input/output 10 is connected to a data wire DTW (FIG. 2A) common to all the memories, which conveys commands, addresses and data in serial form at the same time. Each memory also comprises two inputs IP1, IP0 the electric potential of which is adjusted so as to allocate a determined most significant address to each memory. For example, the two inputs IP1, IP0 of the memory SMEM1 are taken to a supply voltage Vcc to allocate the most significant address "11" to the memory, the inputs IP1, IP0 of the memory SMEM2 are respectively taken to the voltage Vcc and to the ground (GND) to allocate the most significant address "10" to the memory, the inputs IP1, IP0 of the memory SMEM3 are taken to the ground and to the voltage Vcc to allocate the most significant address "01" to the memory and the inputs IP1, IP0 of the memory SMEM4 are taken to the ground to allocate the most significant address "00" to the memory.

Each memory within the extended memory array is selected by sending to the memories commands of the type [OPCODE, I1, I0, AD] comprising an operation code OPCODE, two bits I1, I0 forming a most significant address, and an address AD of N bits forming a least significant address, the most significant address forming, together with the address AD, an extended address. The central processing unit of each memory executes the operation codes OPCODE present in the commands received if the most significant address I1 I0 corresponds to the most significant address IP1 IP0 allocated to the memory. In the case of a read command, the address counter ACNT applies the N address bits $A_{N-1}$-$A_0$ present in the command to the memory array MA, while the central processing unit applies a read signal to the memory array.

U.S. Pat. Nos. 5,303,201 and 5,895,480 disclose memories of the aforementioned type, wherein the address counter (an address buffer in U.S. Pat. No. 5,895,480) is an extended address counter (or an extended address buffer) that receives an extended address instead of receiving only the least significant address. These memories work substantially in the same way as the memory described above, in that the most significant address received by the counter or the address buffer is compared to the most significant address allocated to the memory, and in that a read command is not executed if the most significant address present in an extended address is not identical to the most significant address allocated to the memory.

In summary, the usual method for obtaining an extended memory array involves providing memories capable of "self-identifying" themselves upon receiving a command comprising an extended address, and not executing the command if the most significant address included in the extended address is not identical to the most significant address allocated to the memory. This method is advantageous as far as the number of electric interconnections is concerned, but the extended memory array obtained does not have a unitary character, as far as the execution of a continuous read command is concerned, for example. Therefore, a continuous reading of the extended memory array first of all requires sending to the first memory SMEM1 a command for continuously reading its integrated memory array, such a command comprising the operation code of the command, the most significant address 1,1 of the memory SMEM1, and the least significant address AD0 designating the memory area in which the continuous reading must be initialised in the integrated memory array. Similar commands having appropriate identification bits must then be sent to the other memories, i.e., in total four commands to read the entire extended memory array.

BRIEF SUMMARY OF THE INVENTION

Therefore, a general object of the present invention is to provide a method and a serial memory structure which allow an extended memory array to be produced that has a unitary character, i.e., that behaves, seen from the outside, like a single memory comprising a large memory array.

In one embodiment of the present invention there is an extended memory array having a unitary character as far as the execution of a continuous read command of the memory array is concerned.

In another embodiment of the present invention, there is an extended memory array having a unitary character as far as the execution of particular commands for reading special registers is concerned, such special registers being generally provided in serial memories, such as state registers or identification registers.

In another embodiment of the present invention, there is an extended memory array having a unitary character as far as the read and write protection of the extended memory array when one of the memories executes a write operation is concerned.

One embodiment of the present invention is achieved by providing a memory integrated into a chip, having a serial input/output. A most significant address allocated to the memory is stored within an extended memory array addressable with an extended address comprising a least significant address and a most significant address. At least one read accessible register is provided. Logic supplies a master memory signal having an active value or an inactive value, based on the most significant address allocated to the memory, the master memory signal with the active value meaning that the memory is master within the extended memory array, the master memory signal with the inactive value meaning that the memory is slave within the extended memory array.

In one embodiment, a central processing unit for executing a command for reading the register and for supplying the content of the register to the serial input/output of the memory, only if the memory is master memory within the extended memory array is also provided.

According to one embodiment, a piece of information about the size of the extended memory array is stored. The master memory signal is supplied based on the most significant address allocated to the memory and the piece of information about the size of the extended memory array. According to one embodiment, the piece of information about the size of the extended memory array is the number of bits that the most significant address present in an extended address.

According to one embodiment, there is provided an extended address counter for storing an extended address received at the serial input/output of the memory. Logic compares the most significant address bits of the extended address with the most significant address allocated to the memory. Logic prevents the execution of a command for reading or writing the integrated memory array if the most significant address of the extended address is different to the most significant address allocated to the memory.

The memory may include an output buffer circuit for supplying to the serial input/output of the memory data read in the integrated memory array and a comparator for supplying a signal for blocking the output buffer circuit if the most significant address of the extended address is different to the most significant address allocated to the memory.

According to one method, there is allocated to each memory a most significant address within the extended memory array. In the extended memory array, only one master memory and slave memories are designated. The memories are configured so that only the master memory executes a command for reading the register, and the slave memories do not execute such a command.

BRIEF DESCRIPTION OF THE SEVERAL VIEWS OF THE DRAWINGS

These and other objects, features and advantages of the present invention will be explained in greater detail in the following description of a memory according to the present invention, given in relation with, but not limited to, the following figures:

FIG. 6B represents a second example of an embodiment of the comparator represented in block form in FIG. 4, FIGS. 7A to 7J are timing diagrams representing counting signals and data signals and showing the operation of an extended memory array according to the present invention in response to a continuous read command.

DETAILED DESCRIPTION OF THE INVENTION

Figure 3:
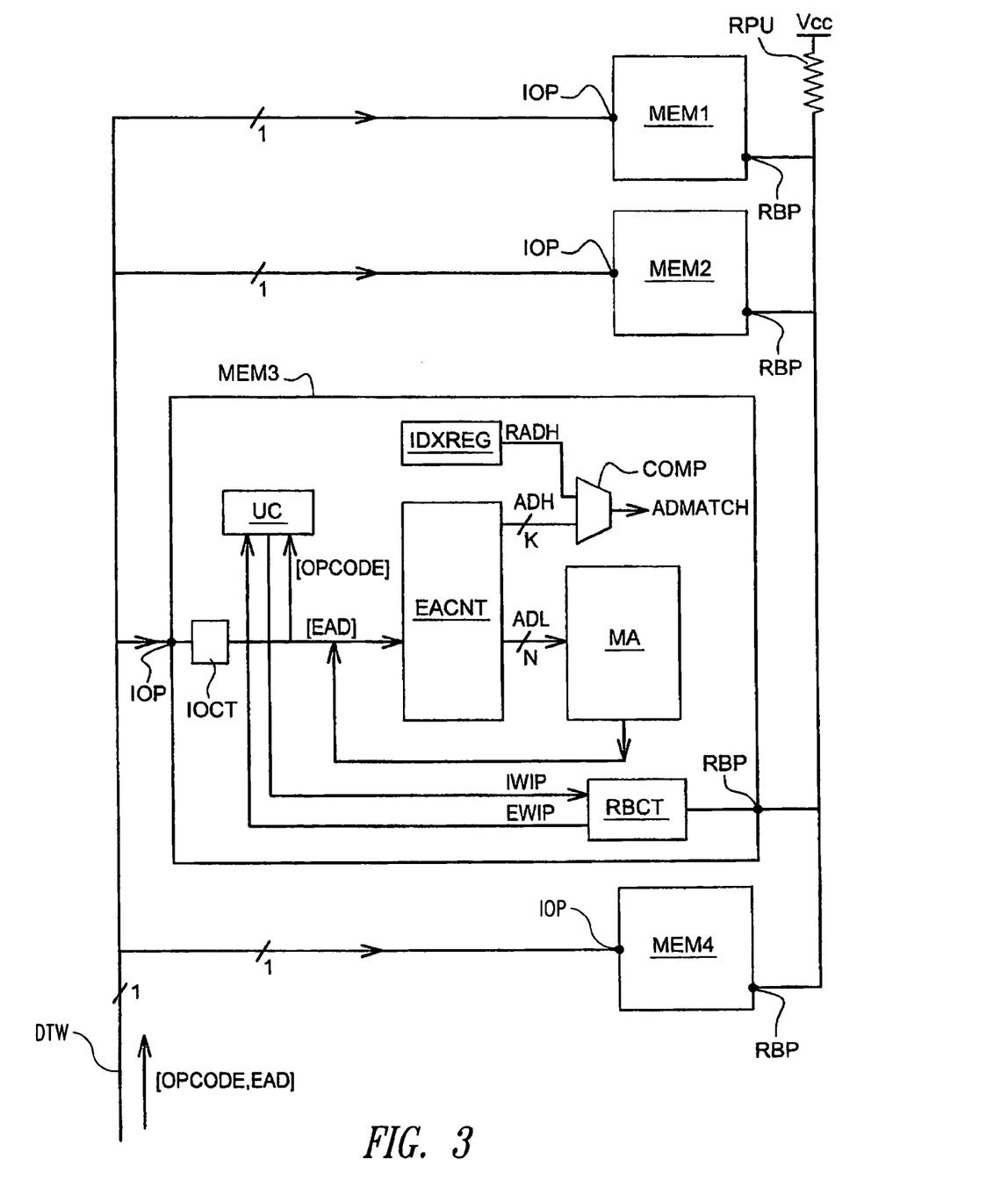
FIG. 3 represents an extended memory array comprising serial memories according to the present invention, and schematically represents the structure of one of these serial memories.

FIG. 3 represents an extended memory array comprising four serial memories MEM1, MEM2, MEM3, MEM4 according to the present invention, integrated into silicon chips. Each memory comprises a serial input/output pad IOP (In/Out Pad), an input/output circuit IOCT converting the data received in serial form into parallel data, and vice versa, an integrated memory array MA addressable under N bits, and a hard-wired logic or microprocessor central processing unit UC. Here and in the following description, it will be assumed, out of concern to keep the presentation simple, that the integrated memory arrays of each memory are identical and that the number N of address bits required to read or write a datum in each of the integrated memory arrays is identical for each memory.

The memories MEM1 to MEM4 have their respective pads IOP linked to a common data wire DTW. This data wire belongs to a serial data bus that can comprise control wires like clock wires, power supply wires, ground wires, etc. that are not shown here.

According to the present invention, the read or write commands sent to the memories via the wire DTW comprise an operation code OPCODE, an address EAD, and possibly a datum DT (for the data write commands), i.e.:

[OPCODE, EAD] (read)

or

[OPCODE, EAD, DT] (write)

The address EAD is an extended address comprising a number N+K of address bits that is greater than the number N of address bits required for the addressing of the integrated memory array of each memory, N+K being at least equal to the number of address bits required for the addressing of the extended memory array considered as a whole.

The extended address EAD thus comprises N least significant address bits $A_{N-1}$-$A_0$ forming a least significant address ADL intended to select a memory area in one of the integrated memory arrays, generally a binary word, and K most significant address bits $A_{N+K-1}, A_{N+K-2} \ldots A_N$ forming a most significant address ADH enabling one of the memories to be designated.

In the example shown, K is equal to 2 since the extended memory array comprises four serial memories. The commands thus comprise addresses of N+2 bits. The address ADL comprises least significant address bits $A_{N-1}$-$A_0$ and the address ADH comprises 2 most-significant address bits $A_{N+1}, A_N$.

Each memory comprises an extended address counter EACNT of N+K bits, here N+2 bits, a comparator COMP having two times K inputs (2*K), here 4 inputs, and a means for storing a most significant reference address RADH allocated to the memory, which represents the address of the memory within the extended memory array, more precisely the address of the integrated memory array of the memory within the extended memory array.

This storage means is for example an indexing register IDXREG comprising K reference bits $R_{K-1}, R_{K-2} \ldots R_0$, here two bits R1, R0, representing the address RADH. For example, the register IDXREG of the memory MEM1 comprises the reference bits "00", the register IDXREG of the memory MEM2 comprises the reference bits "01", the register IDXREG of the memory MEM3 comprises the reference bits "10" and the register IDXREG of the memory MEM4 comprises the reference bits "11".

When a command comprising an extended address is sent on the data wire DTW, each memory receives the command and applies the operation code OPCODE to its central processing unit UC, and saves the extended address EAD in its extended address counter EACNT. The address ADL formed by the first N bits $A_{N-1}$-$A_0$ of the address EAD stored by the counter, is applied to the memory array MA while the address ADH, formed by the K most significant address bits of the address EAD, here the bits $A_{N+1}, A_N$, is applied to K first inputs of the comparator COMP, here two inputs. The latter receives at K other inputs, here two inputs, the reference bits $R_{K-1}$-$R_0$, here the bits R1, R0.

The output of the comparator supplies a signal ADMATCH which is for example on 1 when the most significant bits of the extended address received are identical to the most significant address allocated to the memory, i.e., identical to the reference bits. The signal ADMATCH is used to prevent the memories that are not concerned by the extended address from executing the command received, whether it is a read command or a write command (when the integrated memory arrays are write accessible).

The non-execution of a write command is obtained classically by blocking the execution of the operation code by the central processing unit UC, as far as the write commands are concerned.

According to the present invention, the non-execution of a read command is obtained by allowing the central processing unit of each memory to execute the read operation while preventing the data read from being applied to the serial input/output pad IOP. This method advantageously allows continuous reading of the extended memory array to be performed, as it enables the central processing unit of each memory to be allowed to permanently read its integrated memory array, and the data read to be supplied when the signal ADMATCH changes to 1.

In other respects, it is well known that a single memory cannot simultaneously execute an operation of writing its memory array and an operation of reading its memory array. Similarly, a single memory cannot simultaneously execute two write commands in two different areas of its memory array. Thus, the extended memory array considered as an indivisible whole must refuse to execute a read or a write command when a write command is currently executed by one of the memories, so as to have the same behaviour as a single memory.

Thus, according to another aspect of the present invention, each memory comprises a ready/busy pad RBP and a circuit RBCT for managing the pad RBP. The pads RBP of the memories are interconnected and are taken by default to a high potential, here a supply voltage Vcc, through a pull-up resistance RPU of high value. The resistance RPU is here external to the memories, but can also be internal to each memory, i.e., be integrated onto the silicon microchips.

The circuit RBCT receives a signal IWIP (Internal Write In Progress) sent by the central processing unit, and supplies a signal EWIP (External Write In Progress) to the central processing unit. The signal IWIP is set to 1 by the central processing unit during an operation of writing the integrated memory array (erase and/or programming). When the signal IWIP changes to 1, the circuit RBCT forces the pad RBP to a low potential, for example the ground potential. Furthermore, the circuit RBCT sets the signal EWIP to 1 when it detects the low potential, here the ground potential, on the pad RBP, including when the signal IWIP is on 0. The fact that the signal EWIP is on 1 while the signal IWIP is on 0 means that the ground potential at the pad RBP is imposed by another memory. The signal EWIP thus enables the central processing unit to know that a memory of the extended memory array is performing a write operation in the memory array that is specific to it. The central processing unit then refuses to execute a read or write command that might be received at the input/output pad IOP, while the write is progress is not finished.

Therefore, when a memory executes a write operation, the other memories are informed thereof by the change to 0 of their pad RBP, which results in the signal EWIP changing to 1. The central processing units of these memories then refuse to execute read or write commands. This aspect of the present invention enables the extended memory array to be given a unitary character for writing, since it behaves, seen from the outside, like a single memory.

A detailed embodiment of a serial memory will now be described in relation with FIG. 4 which implements the various aspects of the present invention mentioned above, as well as others that will subsequently be described.

General Aspects of the Memory

Figure 4:
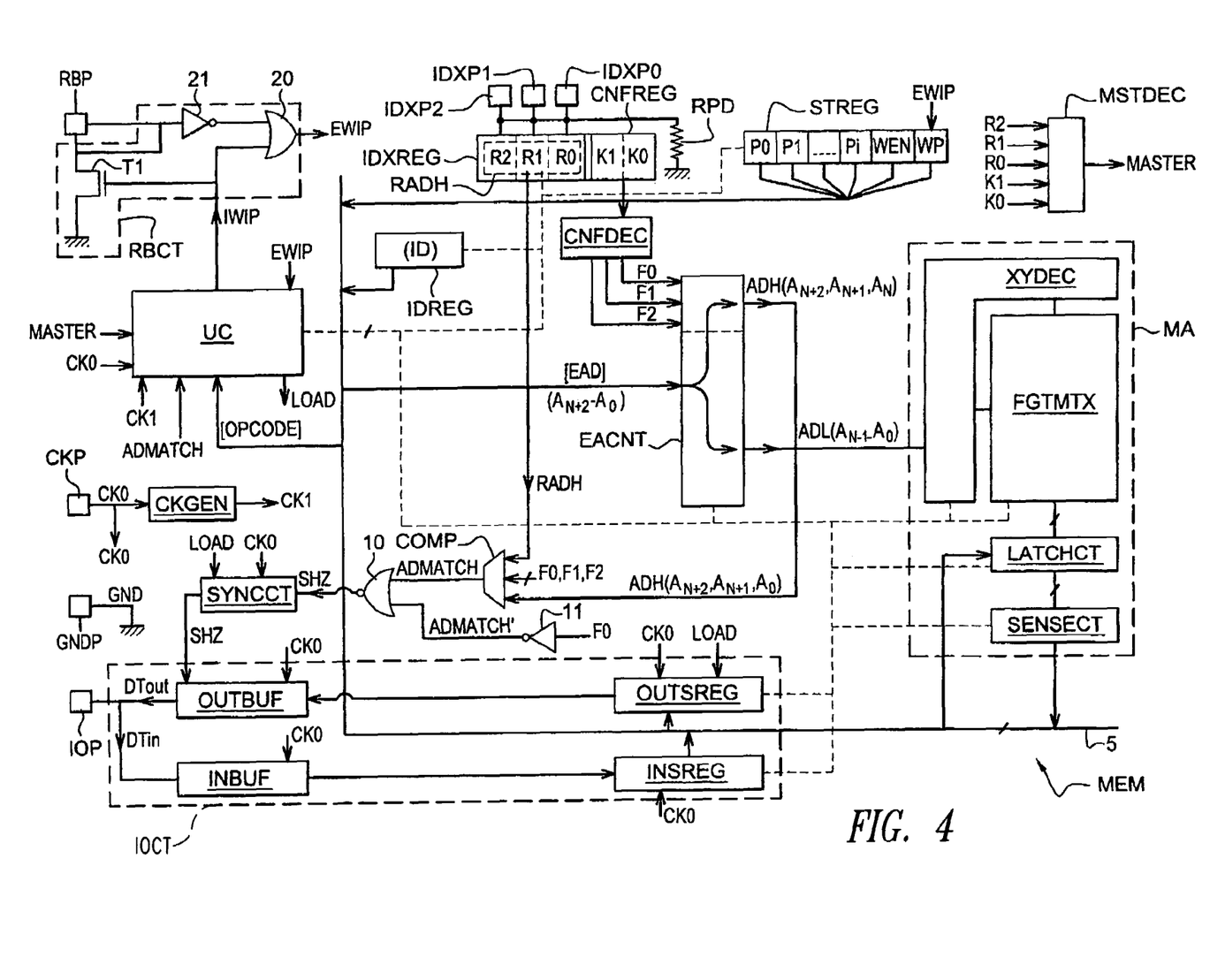
FIG. 4 represents in block form an example of an embodiment of a serial memory according to the present invention.

The memory MEM shown in FIG. 4 comprises the elements described above, i.e.:
the pad IOP forming the serial input/output of the memory,
the ready/busy pad RBP,
the input/output circuit IOCT,
the circuit RBCT for managing the pad RBP,
the central processing unit UC,
the extended address counter EACNT,
the memory array MA addressable under N bits,
the indexing register IDXREG, and the comparator COMP.

The memory also comprises:
- a parallel-type internal data bus 5,
- a ground pad GNDP,
- a clock pad CKP receiving a clock signal CK0,
- a clock circuit CKGEN,
- a synchronisation circuit SYNCCT, and
- two special registers, here a status register STREG and an identification register IDREG.

The input/output circuit comprises an input buffer INBUF having a serial input and output, a shift register INSREG having a serial input and a parallel output, an output buffer OUTBUF having a serial input and output, and a shift register OUTSREG having a parallel input and a serial output. The buffer INBUF has its input linked to the pad IOP and its serial output linked to the serial input of the register INSREG, the output of which is linked to the data bus 5. The register OUTSREG has its input linked to the data bus 5. Its output is linked to the input of the buffer OUTBUF the output of which is linked to the pad IOP.

The memory array MA comprises a matrix of memory cells FGTMTX, for example a matrix of floating-gate transistors, a line and column decoder XYDEC, a programming circuit LATCHCT comprising high voltage latches the inputs of which are linked to the bus 5, and a read circuit SENSECT comprising sense amplifiers the outputs of which are linked to the bus 5.

The special registers STREG and IDREG are read and write accessible via the data bus 5. The register IDREG comprises for example a single identifier ID of the silicon microchip. The status register STREG comprises for example bits P0, P1, . . . Pi for write protecting fractions (parts) of the memory array, one general write protect bit WEN (Write Enable), and one bit WP representative of the current value of the signal EWIP, and generally speaking any useful datum for the management of a memory well-known by those skilled in the art.

The central processing unit controls the various elements of the memory, the control links between the central processing unit and these various elements being schematically represented by a dotted line. In particular, the central processing unit read and/or write controls the various registers, read and write controls the memory array MA and its constituent elements, controls the extended address counter EACNT for loading the extended address and/or for incrementing or decrementing the counter, upon the execution of continuous read commands, controls the loading of the shift registers, etc.

The clock generator CKGEN supplies a clock signal CK1 that is a sub-multiple of the signal CK0. The signal CK0 is a bit clock signal while the signal CK1 is a word clock signal, the frequency of which is equal to the frequency of the clock signal CK0 divided by the number of bits that the binary words present in the memory array comprise. The clock signal CK1 times the operations concerning binary words, particularly of reading or writing the memory array, of incrementing or decrementing the address counter EACNT, of loading a binary word into the register OUTSREG or of reading a binary word in the register INSREG, etc. The clock signal CK0 times the operations linked to sending or receiving bits in serial form, particularly shifting bits in the shift registers OUTSREG, INSREG and timing the buffers OUTBUF, INBUF.

Aspects of the present invention relating to the execution of commands comprising an extended address will now be described.

Execution of Commands Comprising an Extended Address

The operation code OPCODE and the extended addresses EAD received in serial form on the pad IOP are transformed by the register INSREG into parallel data applied to the bus 5, and are respectively applied to an input of the central processing unit and an input of the extended address counter EACNT. When an address EAD has been saved in the address counter EACNT, the latter supplies the first N address bits $A_{N-1}$-$A_0$ (address ADL) to the decoder XYDEC, and supplies the most significant address bits $A_{N+2}$, $A_{N+1}$, $A_N$ (address ADH) to first inputs of the comparator COMP.

The indexing register IDXREG here comprises three reference bits R2, R1, R0 which form the most significant reference address RADH allocated to the memory within the extended memory array. This extended memory array is therefore addressable at the most under N+3 bits (K=3), and its size cannot be greater here than 8 times the size of the integrated memory array MA. An extended address here therefore comprises, at the most, 3 most significant address bits $A_{N+2}$, $A_{N+1}$, $A_N$.

The bits R2, R1, R0 are applied to second inputs of the comparator COMP the output of which supplies the signal ADMATCH described above.

The signal ADMATCH is applied to the central processing unit to block the execution of write commands. The signal ADMATCH is also applied to an input of a NOR gate 10 with two inputs, the output of which supplies a signal SHZ (Set High Z). The signal SHZ is applied to a control input of the output buffer OUTBUF through the synchronisation circuit SYNCCT. The output buffer OUTBUF is a three status buffer that can have an output status on 0 (ground), on 1 (Vcc) or at high impedance (HZ). When the signal SHZ is on 1, the buffer OUTBUF sets its output to high impedance. The synchronisation circuit SYNCCT is generally transparent for the signal SHZ, except in a particular case described below.

Thus, when the most significant bits present in an extended address received in a command do not correspond to the reference bits, the signal ADMATCH changes to 0 and the signal SHZ changes to 1, which causes the output of the buffer OUTBUF to switch to the high impedance state and the data applied to the serial input of the buffer are no longer sent to the input/output pad IOP.

Thus, in accordance with the method according to the present invention for not executing a read command, the central processing unit is allowed to execute a read command even if the most significant address present in the extended address does not correspond to the most significant address allocated to the memory, since the data applied to the serial input of the buffer are prevented from being applied to the serial input/output of the memory, here due to the high impedance state of the buffer.

The circuit SYNCCT becomes non transparent in relation to the signal SHZ when a signal LOAD for loading a binary word is applied to the shift register OUTSREG by the central processing unit. From that instant, the circuit SYNCCT counts a number of clock cycles CK0 corresponding to the number of bits present in a binary word, i.e., one clock cycle CK1, and becomes transparent again when the cycle of sending the binary word is finished. Thus, if the signal SHZ changes to 1 while a binary word is being sent bit by bit to the output pad IOP, the blocking (setting to high impedance) of the output buffer only occurs after the entire word has been sent.

The aspects of the present invention relating to the read protection of the extended memory array during a write operation will now be described.

Protection of the Extended Memory Array During a Write Operation

The circuit RBCT comprises a switch transistor Ti, here of NMOS type, an OR gate 20 and an inverting gate 21. The drain and source terminals of the transistor T1 are respectively connected to the pad RBP and to the ground, while the gate of the transistor is driven by the signal IWIP supplied by the central processing unit. The gate 21 is connected at input to the pad RBP. The gate 20 receives the signal IWIP at one input, the output of the gate 21 at another input, and its output supplies the signal EWIP.

As indicated above, the signal IWIP is set to 1 when the central processing unit performs an erase and/or programming operation in the memory array. The pad RBP, which is biased to the voltage Vcc by the resistance RPU described above, is then forced to 0 (ground) by the transistor T1. Furthermore, if the pad RBP is forced to 0 by another memory (the pads RBP being interconnected), the signal EWIP changes to 1 even if the signal IWIP is on 0. Therefore, when IWIP=0 and EWIP=1, the central processing unit knows that another memory is being written and refuses to execute a read or write command, for the reasons explained above.

Aspects of the present invention relating to the obtaining of a serial memory which is configurable and which can be incorporated into an extended memory array of variable size will now be described.

Obtaining of a Configurable Memory

The memory comprises a configuration register CNFREG and a configuration decoder CNFDEC. The register CNFREG comprises a piece of information about the size of the extended memory array into which the memory is incorporated. This piece of information is here the number K that is binary coded by means of two bits K1, K0, and can vary between K=0 and K=Kmax=3. The size of the extended memory array is therefore equal to $2^K$ times the size of the integrated memory array MA, i.e., a number of memory points (binary words) equal to $2^K*2^N$ or $2^{N+K}$.

The output of the register CNFREG is applied to the configuration decoder CNFDEC which supplies, as from K, three flags F2, F1, F0 indicating the number of most significant address bits that the extended address of the extended memory array comprises.

It should be noted that the flags F2, F1, F0 can also be directly saved in the register CNFREG, the storage of the parameter K in binary form being provided here to reduce the size of the register CNFREG.

Table 1 below describes the relation between the number K and the flags F2, F1, F0. The first column describes the decimal value of K. The second column describes the binary value of K (bits K1, K0). The third column describes the size of the extended memory array. The fourth, fifth and sixth columns respectively describe the values of the flags F2, F1, F0 for each value of K. The seventh column gives the most significant address bits (address bits in excess of the first N bits) that the extended address comprises, for each value of K. The last column describes the maximum value MSBmax of the most significant address in the extended memory array, for each value of K.

It can be seen in table 1 that a flag F2, F1, F0 is on 1 when the corresponding most significant bit is used in the extended address.

Thus, K is a programmable variable that can vary from 0 to Kmax, here with Kmax=3, and the configuration register allows the memory to be incorporated into an extended memory array comprising 2 (K=1), 4 (K=2) or 8 (K=3) memories having an integrated memory array addressable under N bits, or it may be incorporated into a composite extended memory array (consisting of memories of different sizes) addressable under N+K bits.

It can also be seen in table 1 that the flag F0 is on 0 only when K is equal to 0. In other terms, the fact that the flag F0 is on 0 means that the memory is not integrated into an extended memory array, and that there is no most significant address. The memory then operates in "classical" mode, i.e., by executing all the commands without its operation depending on the comparison of the most significant address bits and the reference bits R2, R1, R0.

TABLE 1

| $K_{(decimal)}$ | K1 K0 | $2^K*2^N$ | F2 | F1 | F0 | MSB | MSBmax |
|---|---|---|---|---|---|---|---|
| 0 | 00 | $2^N$ | 0 | 0 | 0 | — | — |
| 1 | 01 | $2*2^N$ | 0 | 0 | 1 | $A_N$ | 1 |
| 2 | 10 | $4*2^N$ | 0 | 1 | 1 | $A_{N+1} A_N$ | 11 |
| 3 | 11 | $8*2^N$ | 1 | 1 | 1 | $A_{N+2} A_{N+1} A_N$ | 111 |

In order to inhibit the mechanism for comparing the most significant addresses and the reference bits when F0=0, the flag F0 is applied to the input of an inverting gate 11 the output of which supplies a signal ADMATCH'. The signal ADMATCH' is applied to the second input of the gate 10. Thus, when F0=0, ADMATCH' is on 1 and the signal SHZ is forced to 0, such that the buffer OUTBUF cannot be put into the high impedance state.

Furthermore, in order to adapt the operation of the memory to the number K of most significant bits that the extended addressing comprises, the extended address counter and/or the comparator have a variable configuration that varies according to K.

Figure 5A:
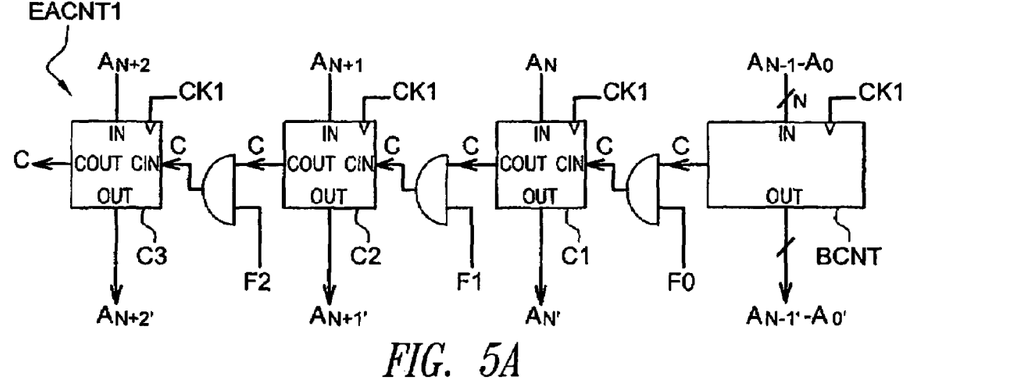
FIG. 5A represents a first example of an embodiment of an extended address counter represented in block form in FIG. 4.
Figure 5B:
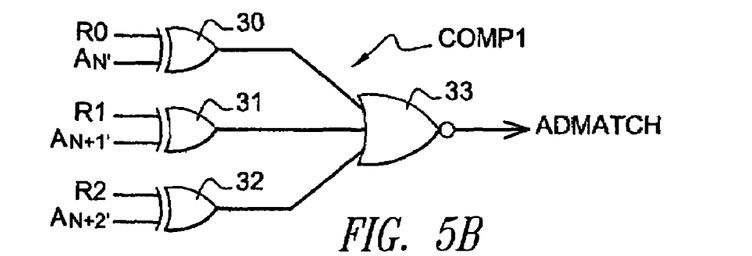
FIG. 5B represents a first example of an embodiment of a comparator represented in block form in FIG. 4.

FIGS. 5A and 5B respectively represent a first embodiment EACNT1 of the extended address counter and a first embodiment COMP1 of the comparator. According to this first embodiment of-these elements, the address counter comprises a variable number of active counting cells, which varies according to K, while the comparator comprises a number of comparison inputs that is fixed and equal to Kmax.

More particularly, the address counter EACNT1 comprises a basic counting block BCNT comprising N counting cells of 1 bit each (not shown) and three additional counting cells C1, C2, C3 of 1 bit each, arranged outside the basic counting block. The various counting cells are timed by the clock signal CK1.

The basic counting block BCNT receives at input the address bits $A_{N-1}$-$A_0$, i.e., the address ADL, and supplies address bits $A_{N-1}'$-$A_0'$. The address bits $A_{N-1}'$-$A_0'$ are equal to the address bits received at input in the case of a fixed address read or write command, or form an address incremented or decremented at the pace of the clock signal CK1 in the case of a continuous read command. The counting block BCNT supplies a carry bit C when it reaches the overflow value (all the address bits on 1) and at the time at which it changes back to 0.

The counting cells C1, C2, C3 each comprise an input IN for receiving a most significant address bit, respectively $A_N$, $A_{N+1}$, $A_{N+2}$, forming together the address ADH, and an output supplying address bits $A_N'$, $A_{N+1}'$, $A_{N+2}'$, respectively. Each counting cell C1, C2, C3 comprises an input CIN for receiving the bit C of previous rank and an output COUT for supplying the bit C of following rank. The input CIN of the cell C1 receives the bit C supplied by the block BCNT through an AND gate the other input of which receives the flag F0. The input CIN of the cell C2 receives the bit C supplied by the cell C1 through an AND gate the other input of which receives the flag F1. The input CIN of the cell C3 receives the bit C supplied by the cell C2 through an AND gate the other input of which receives the flag F2. When the flags F0, F1, F2 are on 1 (K=Kmax=3) the three cells are active and cascade connected to the block BCNT. The address bits $A_N'$, $A_{N+1}'$, $A_{N+2}'$ are then equal to the address bits received at input in the case of a fixed address read or write command, or form a most significant address incremented or decremented at the pace of the clock signal CK1 in the case of a continuous read command. When the flag F2 is on 0 and the flags F1, F0 on 1 (K=2), the cell C3 is disconnected from the rest of the counter by the corresponding AND gate. Its output remains on 0 during a continuous read cycle and does not intervene in the determination of the signal ADMATCH supplied by the comparator. When the flags F2, F1 are on 0 and the flag F0 on 1 (K=1), the cells C3, C2 are disconnected from the rest of the address counter and their outputs remain on 0 during a continuous read cycle and do not intervene in the determination of the signal ADMATCH supplied by the comparator. Finally, when the flags F0 to F2 are all on 0, the three cells are disconnected and the address counter only comprises the basic counter BCNT, which is equivalent to an address counter of a classical memory. In this case, the memory operates in "classical" mode: the signal ADMATCH' is on 1 and forces the signal SHZ to 0, as described above.

The comparator COMP1 shown in FIG. 5B comprises gates 30, 31, 32 of EXCLUSIVE OR type and a gate 33 of NOR type. The gate 30 receives the reference bit R0 and the most significant address bit $A_N'$ at input. The gate 31 receives the reference bit R1 and the most significant address bit $A_{N+1}'$ at input. The gate 32 receives the reference bit R2 and the most significant address bit $A_{N+2}'$ at input. The gate 33 has three inputs respectively linked to the outputs of the gates 30, 31, 32, and supplies the signal ADMATCH.

Figure 6A:
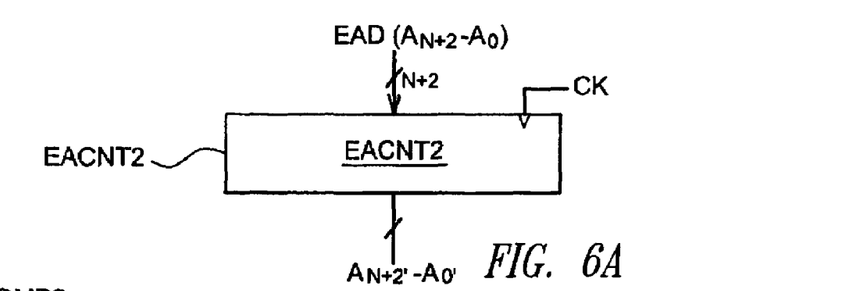
FIG. 6A represents a second example of an embodiment of the extended address counter represented in block form in FIG. 4.
Figure 6B:
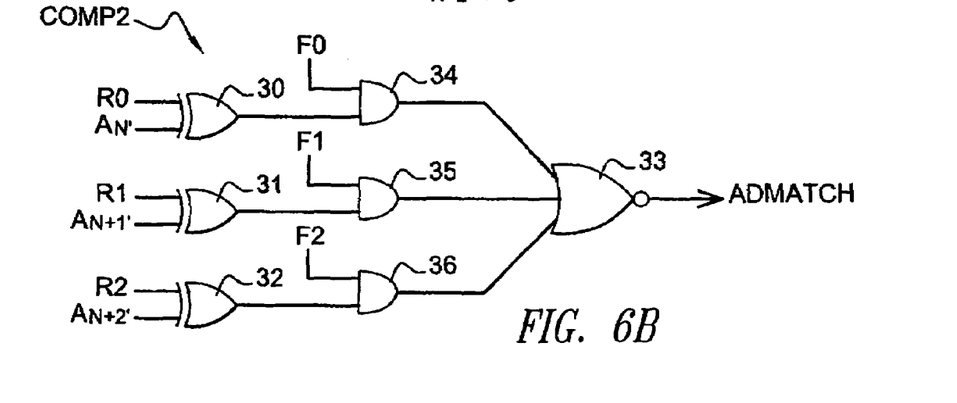

FIGS. 6A and 6B respectively represent a second embodiment EACNT2 of the extended address counter and a second embodiment COMP2 of the comparator. According to this second embodiment, the address counter EACNT2 comprises an invariable number N+Kmax of active counting cells. The counter EACNT2 is equivalent to the counter EACNT1 in which the AND gates enabling the carry bits C to be filtered are removed and replaced by direct connections.

The comparator COMP2 has the same gates as the comparator COMP1 described above, designated by the same references. It further comprises gates 34, 35, 36 of AND type. The gate 34 receives the output of the gate 30 and the flag F0 at input. Its output is applied to the first input of the gate 33. The gate 35 receives the output of the gate 31 and the flag F1 at input. Its output is applied to the second input of the gate 33. The gate 36 receives the output of the gate 32 and the flag F2 at input. Its output is applied to the third input of the gate 33. Thus, the inputs of the comparator are inhibited by the flags F0, F1, F2, when the latter are on 0. More particularly, the inputs of the comparator corresponding to the inputs of the gate 30 are inhibited when the flag F0 is on 0. The inputs of the comparator corresponding to the inputs of the gates 30, 31 are inhibited when the flags F0, F1 are on 0. Finally, all the inputs of the comparator are inhibited when all the flags F0, F1, F2, are on 0, the signal ADMATCH then being forced to 1. This embodiment of the comparator enables the gates 10, 11 to be removed, the signal ADMATCH being capable of being directly applied to the circuit SYNCCT.

In conclusion, the serial memory according to the present invention has a programmable configuration enabling it to operate like a classical serial memory, or to be integrated into an extended memory array the size of which is twice, 4 times or 8 times the size of its own memory array.

The programming of the configuration register CNFREG is preferably done by software, by means of a specific command that the central processing unit executes. This programming can be provided when all the memories are interconnected, since the value of K is the same for all the memories. The programming of the indexing register IDXREG must, on the other hand, be performed before interconnecting the memories, since each memory must receive an individual most significant address, and executing an individual command for writing the register IDXREG is not possible while a most significant address is not entered therein. The register IDXREG can for example be programmed during the manufacturing of the silicon microchips, which are then classified by batches, each batch corresponding to a most significant address. However, this solution goes against the flexibility sought. According to the present invention, a more advantageous solution involves providing electric pads, here three pads IDXP0, IDXP1, IDXP2 linked to inputs of the register IDXREG respectively corresponding to the reference bits R0, R1, R2. The pads IDXP0, IDXP1, IDXP2 are linked to the ground by a pull-down resistance RPD of high value, individual or collective. When the silicon microchip is arranged in a case, each pad IDXP0, IDXP1, IDXP2 is connected to the voltage Vcc to program the corresponding reference bit to 1, or is left disconnected to program the corresponding reference bit to 0. If none of the three pads IDXP0, IDXP1, IDXP2 is connected to the voltage Vcc, all the reference bits are on 0 and the memory operates in "classical" mode. Various improvements of this static programming by wiring principle can be provided by those skilled in the art. Particularly, a control circuit can be provided enabling the resistance RPD to be disconnected from the pads IDXP0, IDXP1, and IDXP2 when the register IDXREG is programmed, to avoid a leakage current permanently circulating in the resistance RPD.

Table 2 below describes the various most significant addresses that can be loaded into the register IDXREG according to the value of K (K1 K0) loaded into the register CNFREG.

TABLE 2

| CNFREG (K1 K0) | IDXREG (R2 R1 R0) |
|---|---|
| 00 | 000 |
| 01 | 000 or 001 |
| 10 | from 000 to 011 |
| 11 | from 000 to 111 |

An aspect of the present invention relating to reading one of the special registers will now be described. The aim of the present invention is here to make sure that, when a command for reading such a register is applied to a set of memories, a single memory processes the command and supplies the content of the special register on the serial bus, to avoid collisions between responses.

Reading of Special Registers

The memory comprises a master memory decoder MSTDEC that supplies a signal MASTER (FIG. 4). When the signal MASTER is on 1, the memory is considered to be master memory within the extended memory array while the other memories are considered to be slaves. As only one memory can be master within the same extended memory array, the signal MASTER must be on 1 for a single memory. According to the present invention, one solution out of others is to grant the status of master memory to the one that receives in the register IDXREG a most significant address that is the most significant one of the extended memory array. For this purpose, the decoder MSTDEC receives the reference bits R0, R1, R2 and the bits K1, K0 forming the number K at input. Table 3 below describes the logic function for producing the signal MASTER executed by the decoder MSTDEC. It can be seen that for each value of K, the signal MASTER is on 1 when the most significant address R2 R1 R0 corresponds to the highest possible value in the extended memory array. When K=0, the signal MASTER is always on 1 since the memory is operating in the "classical" mode.

According to the present invention, the central processing unit UC is configured to only execute a command for reading one of the special registers STREG, IDREG if the signal MASTER is on 1. The register is then transferred to the output IOP of the memory via the internal data bus 5 and the circuit IOCT. Therefore, seen from the outside, the extended memory array has a unitary character as far as reading the special registers is concerned since it is always the master memory that responds to the read commands. In other terms, everything happens as if the extended memory array only comprised one of each of the special registers, those of the slave memories never being read and remaining inaccessible from the outside.

TABLE 3

| $K_{(decimal)}$ | CNFREG (K1 K0) | IDXREG (R2 R1 R0) | MASTER |
|---|---|---|---|
| 0 | 00 | 000 | 1 |
| 1 | 01 | 001 | 1 |
| 1 | 01 | 000 | 0 |
| 2 | 10 | 011 | 1 |
| 2 | 10 | from 000 to 010 | 0 |
| 3 | 11 | 111 | 1 |
| 3 | 11 | from 000 to 110 | 0 |

The special registers of the slave memories, although they are not read accessible, must however be programmed since they can affect the operation of these memories. Therefore, according to the present invention, the write protect bits P0 to Pi are allocated to write protecting fractions of the extended memory array rather than to protecting fractions of the integrated memory array of the memory in which they are saved. These bits thus relate to each of the memories, particularly those that, as applicable, are part of the fraction of the extended memory array to be write protected. Also, the bit WEN is used like a collective bit allocated to the general write protection of the extended memory array, and not to write protecting a determined memory.

Thus, and contrary to the read commands, commands for writing the special registers are executed by all the memories, whether master or slave. The special registers therefore contain strictly the same value in each of the memories of the extended memory array and each form the equivalent of a single collective register.

One alternative of this aspect of the present invention involves giving the status of master memory to the memory having the least significant of the most significant addresses, i.e., all the reference bits on 0. In this case, it is not necessary for the memory to compare its reference bits with the bits K0, K1 of the number K to find out whether it is master memory or not.

Continuous Reading of the Extended Memory Array

The execution of a continuous read command will now be described in greater detail. Such a command comprises a start read extended address EAD0, i.e., an address of N+K bits:

[CODE(continuous_read), $EAD_0$]

When such a continuous read command is received, the respective central processing units of the memories continually and simultaneously increment or decrement their extended address counters, and each supply the data requested when the most significant bits of the extended address counter become equal to the reference bits present in the indexing register. As the respective extended address counters of the various memories comprise at each instant the same extended address value, the memories automatically take turn to supply on the serial bus the content of their respective integrated memory arrays, which corresponds, seen from the outside, to a single memory comprising an integrated memory array that is large in size which would perform an operation of continuously reading its memory array.

Figure 7A:
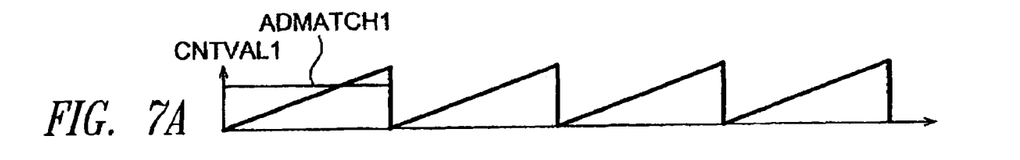
Figure 7B:
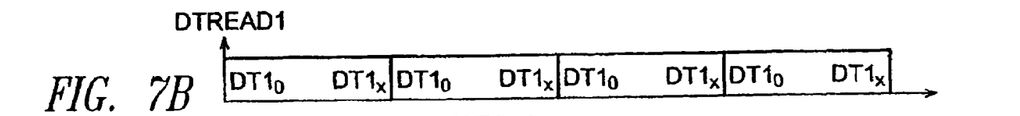
Figure 7C:
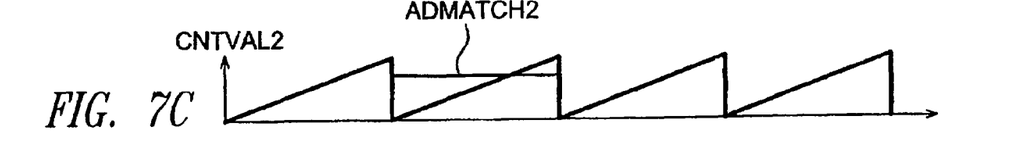
Figure 7D:
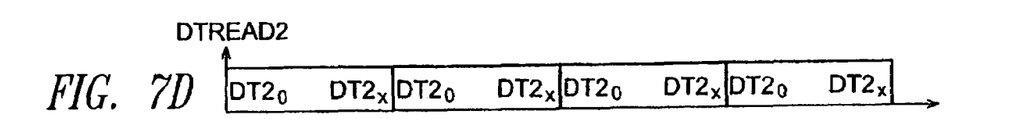
Figure 7E:
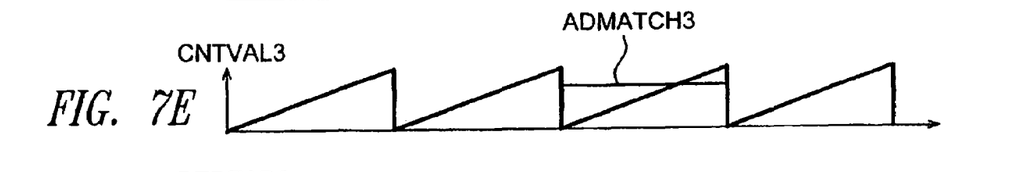
Figure 7F:
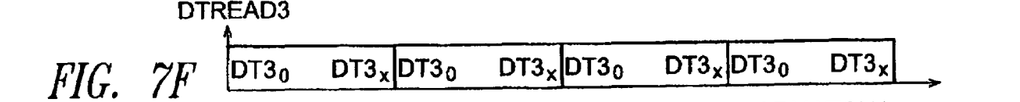
Figure 7G:
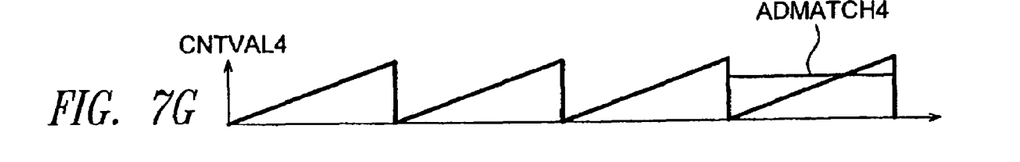
Figure 7H:
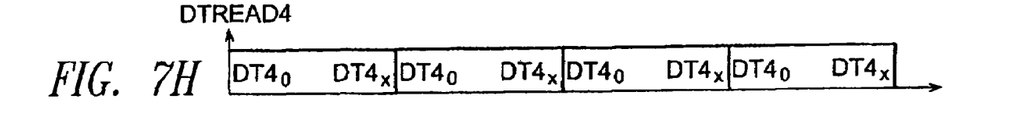
Figure 7I:
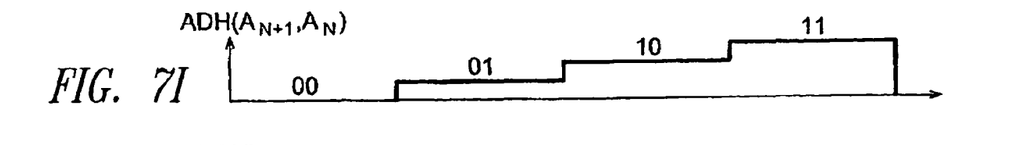
Figure 7J:
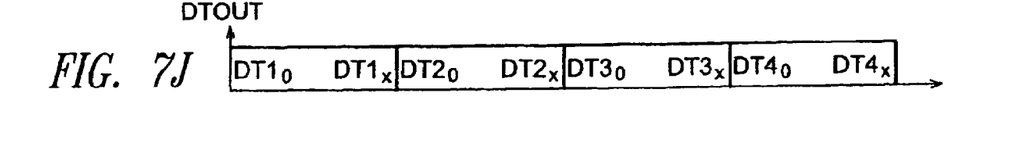

For a better understanding, FIGS. 7A to 7J show the execution of a command for continuously reading the extended memory array shown in FIG. 3, formed by the memories MEM1 to MEM4. FIGS. 7A, 7C, 7E, 7G, represent counting values CNTVAL1, CNTVAL2, CNTVAL3, CNTVAL4 formed by the first N bits of the extended address counter of the memories MEM1, MEM2, MEM3, MEM4, respectively, i.e., the addresses ADL. FIGS. 7A, 7C, 7E, 7G, also represent the values of the signals ADMATCH1, ADMATCH2, ADMATCH3, ADMATCH4 at the output of the respective comparators of the memories MEM1, MEM2, MEM3, MEM4. FIGS. 7B, 7D, 7F, 7H represent the data DTREAD1, DTREAD2, DTREAD3, DTREAD4 read in the integrated memory arrays of the memories MEM1, MEM2, MEM3, MEM4, respectively. FIG. 7I represents the most significant counting value formed by the two most significant bits $A_{N+1}$, $A_N$ (since here K=2) present in the extended address counter of each memory, i.e., the address ADH. FIG. 7J represents the data DTOUT that are supplied by the integrated memory array. It is assumed here that the continuous reading starts at the zero address of the extended memory array, and that the memory MEM1 is the one which has the least significant of the most significant addresses, i.e., $A_{N+1}$ $A_N$=00.

During the continuous read, the least significant counting values CNTVAL1, CNTVAL2, CNTVAL3, CNTVAL4 perform several counting cycles by going back to zero every time (FIG. 7A, 7C, 7E, 7G) while the most significant counting value increases by one unit with each cycle. Upon each cycle, the central processing units of the memories read all of their respective memory arrays, but these data are only supplied at output when the signal ADMATCH is on 1. Therefore, the data supplied during the first counting cycle are those that are read by the memory MEM1, and extend from the first binary word DT10 to the last binary word DT1x present in the memory MEM1. The data supplied during the second counting cycle are those that are read by the memory MEM2 and extend from the first binary word DT20 to the last binary word DT2x present in the memory MEM2. Similarly, the data supplied during the third counting cycle are those that are read by the memory MEM3 and extend from the first binary word DT30 to the last binary word DT3x present in the memory MEM3. During the fourth and last counting cycle, the data supplied are those that are read by the memory MEM4, and extend from the first binary word DT40 to the last binary word DT4x present in the memory MEM4. However, the read process can be stopped at any instant, and is generally triggered by ceasing to apply the clock signal CK0 to the memories.

Thus, the non-execution of a continuous read command by reading the integrated memory array while blocking the data at the output of the memory, has a decisive advantage compared with a method that would involve not reading the memory array. Such other method would require providing a complex decoder that would receive all the address bits of the counter to anticipate the instant at which data are going to be supplied, so as to initialise the reading of the memory array in due time during the execution of a continuous read command during which the extended address counter is constantly incremented or decremented.

It will be understood by those skilled in the art that various alternatives and embodiments of a memory according to the present invention may be made.

Various combinations of the means of the present invention can be provided, it being possible not to implement certain means.

In particular, the implementation of the ready/busy pad RBP and of the signal EWIP is only justified if the integrated memory array of each memory is both read and write accessible (for example a memory array of Flash or EEPROM type).

Also, providing the configurable address counter and/or the configurable comparator is only justified if it is desirable to provide a configurable memory, intended to be incorporated into an extended memory array the size of which is not predetermined.

Similarly, providing the master memory signal is not required and would be used in embodiments if it is desirable to provide an extended memory array capable of responding to a command for reading special registers.

Finally, although an extended memory array comprising memories having integrated memory arrays of the same size was described above for the sake of simplicity, the present invention also applies to the production of a composite extended memory array. In this case, N and K are different in each memory but the sum of N and of K is constant and equal to the number of bits that the extended address of the composite extended memory array comprises.

The invention claimed is:

1. A memory integrated into a chip, comprising:
   a serial input/output;
   means for storing a most significant address allocated to the memory within an extended memory array addressable with an extended address comprising a least significant address and a most significant address;
   an integrated memory array addressable with the least significant address;
   at least one read accessible register to configure the memory;
   means for supplying a master memory signal having an active value or an inactive value, based on the most significant address allocated to the memory, the master memory signal with the active value meaning that the memory is master within the extended memory array, the master memory signal with the inactive value meaning that the memory is slave within the extended memory array; and
   a central processing unit for executing a command for reading the register and for supplying the content of the register to the serial input/output of the memory, only if the memory is master memory within the extended memory array.

2. The memory according to claim 1, comprising:
   means for storing a piece of information about the size of the extended memory array; and
   means for supplying the master memory signal based on the most significant address allocated to the memory and the piece of information about the size of the extended memory array.

3. The memory according to claim 2 wherein the piece of information about the size of the extended memory array comprises the number of bits that the most significant address present in an extended address comprises.

4. The memory according to claim 2 wherein the master memory signal is taken to the active value if the most significant address allocated to the memory is the most significant one allocated within the extended memory array.

5. The memory according to claim 2 wherein the means for supplying a master memory signal comprise a decoding circuit receiving the piece of information about the size of the extended memory array and the most significant address allocated to the memory.

6. The memory according to claim 1 wherein said read accessible register is a status register comprising bits for write protecting the extended memory array.

7. The memory according to claim 1 wherein said read accessible register is an identification register comprising an identification datum of the memory.

8. The memory according to claim 1 wherein the central processing unit is configured for executing a command for writing the register whatever the value of the master memory signal.

9. The memory according to claim 1, comprising:
   an extended address counter for storing an extended address received at the serial input/output of the memory;
   means for comparing the most significant address bits of the extended address with the most significant address allocated to the memory; and
   means for preventing the execution of a command for reading or writing the integrated memory array if the most significant address of the extended address is different to the most significant address allocated to the memory;
   an output buffer circuit for supplying to the serial input/output of the memory data read in the integrated memory array; and
   a comparator for supplying a signal for blocking the output buffer circuit if the most significant address of the extended address is different to the most significant address allocated to the memory.

10. The memory according to claim 1, comprising specific pads enabling the most significant address allocated to the memory to be configured, by applying determined electric potentials to each of the specific pads.

11. The memory according to claim 1 wherein
    the most significant address of the memory that is master must be different from any other memory within the extended memory array.

12. The memory according to claim 1 wherein
    the memory may be read or written when the memory is slave; and
    the read accessible register is a separate storage register.

13. A method for producing an extended memory array addressable with an extended address comprising a least significant address and a most significant address, the extended memory array comprising a plurality of serial memories integrated into chips, each memory comprising a serial input/output, an integrated memory array addressable with the least significant address, and at least one register that is read accessible after applying a command for reading the register to the memory, the serial inputs/outputs of the memories being interconnected, a method comprising the steps of:
- allocating to each memory a most significant address within the extended memory array;
- designating, in the extended memory array, only one master memory and slave memories; and
- configuring a selected register within each of the respective memories so that only the master memory executes a command for reading the register and the slave memories do not execute such a command.

14. The method according to claim 13, comprising:
- storing the most significant address allocated to the memory;
- supplying a master memory signal having an active value or an inactive value, based on the most significant address allocated to the memory, the master memory signal with the active value meaning that the memory is master within the extended memory array, the master memory signal with the inactive value meaning that the memory is slave within the extended memory array; and
- executing a command for reading the register and for supplying the content of the register to the serial input/output of the memory, only if the memory is master memory within the extended memory array.

15. The method according to claim 14, comprising:
- storing a piece of information about the size of the extended memory array; and
- supplying the master memory signal based on the most significant address allocated to the memory and the piece of information about the size of the extended memory array.

16. The method according to claim 15 wherein the piece of information about the size of the extended memory array comprises the number of most significant bits present in an extended address applied to the memory array.

17. The method according to claim 16 wherein each memory supplies the master memory signal by means of a circuit for decoding the piece of information about the size of the extended memory array and of the most significant address allocated to the memory.

18. The method according to claim 13 wherein a memory is master memory if it is allocated the most significant of the most significant addresses within the extended memory array.

19. The method according to claim 13 wherein said read accessible register is a status register comprising bits for write protecting the extended memory array.

20. The method according to claim 13 wherein said read accessible register is an identification register comprising an identification datum of the memory.

21. The method according to claim 13 wherein a command for writing said read accessible register is executed by all the memories.

22. The method according to claim 13 wherein
the most significant address of the memory that is master must be different from the most significant address of any other memory in the extended memory array.

23. A memory comprising:
- a plurality of memories, each memory comprising an input/output, an integrated memory array addressable under N bits,
- a most significant address within the memory array, allocated to each memory;
- logic configured for designating, in the memory array, only one master memory;
- logic configured for designating other memories as slaves, and
- logic configured to protect the memories so that only the master memory executes a command for reading the register, and the slave memories will not execute a read register command, but may execute other read commands.

24. The system of claim 23 where the memories incorporated comprise serial input/output circuits.

25. The memory of claim 23 where the logic configured to protect the memories, comprises:
- ready/busy pad in each memory;
- logic within each memory, configured to force the ready/busy pad to a determined electric potential, during an operation of erasing or programming the memory array;
- interconnecting the ready/busy pads of the memories; and
- logic configured to execute a command for reading or writing the integrated memory array of each memory dependant on the state of the ready/busy pad.

26. A memory
addressable under N bits, comprising:
- at least one read accessible register;
- logic configured to store a most significant address having N least significant bits and K most significant bits;
- logic configured to supply a signal, based on the most significant address allocated to the memory, the signal defining the memory as master or slave within a memory array, wherein the memory within an extended memory array may be read or written when the memory is slave; and
- a central processing unit configured to execute a command to read the register, only if the memory is master memory within the memory array.

* * * * *